(12) United States Patent
Macris et al.

(10) Patent No.: US 7,663,227 B2
(45) Date of Patent: Feb. 16, 2010

(54) LIQUID METAL THERMAL INTERFACE MATERIAL SYSTEM

(76) Inventors: Chris G. Macris, P.O. Box 313, North Bend, WA (US) 98045; Robert G. Ebel, 10714 Interlake Ave. N., Seattle, WA (US) 98133; John C. McCullough, 20635 6th Ave. SW., Normandy Park, WA (US) 98166

( * ) Notice: Subject to any disclaimer, the term of this patent is extended or adjusted under 35 U.S.C. 154(b) by 55 days.

(21) Appl. No.: 12/028,235

(22) Filed: Feb. 8, 2008

(65) Prior Publication Data
US 2008/0137300 A1    Jun. 12, 2008

Related U.S. Application Data

(63) Continuation-in-part of application No. 11/248,720, filed on Oct. 11, 2005.

(51) Int. Cl.
  *H01L 23/10* (2006.01)
  *H01L 23/34* (2006.01)

(52) U.S. Cl. .................. 257/706; 257/707; 257/720; 257/E23.109

(58) Field of Classification Search ............ 257/706, 257/707, 720, E23.109; 438/118
See application file for complete search history.

(56) References Cited

U.S. PATENT DOCUMENTS

| | | | |
|---|---|---|---|
| 6,617,682 B1 * | 9/2003 | Ma et al. | 257/706 |
| 6,665,186 B1 * | 12/2003 | Calmidi et al. | 361/704 |
| 6,794,223 B2 * | 9/2004 | Ma et al. | 438/122 |
| 7,019,971 B2 * | 3/2006 | Houle et al. | 361/699 |
| 7,220,624 B2 * | 5/2007 | Neogi et al. | 438/125 |
| 7,510,108 B2 * | 3/2009 | Lawlyes et al. | 228/179.1 |
| 2001/0013424 A1 * | 8/2001 | Takase et al. | 174/260 |

* cited by examiner

*Primary Examiner*—Ngan Ngo
(74) *Attorney, Agent, or Firm*—Jensen & Puntigam, P.S.

(57) ABSTRACT

A metal thermal interface structure for dissipating heat from electronic components comprised a heat spreader lid, metal alloy that is liquid over the operating temperature range of the electronic component, and design features to promote long-term reliability and high thermal performance.

41 Claims, 14 Drawing Sheets

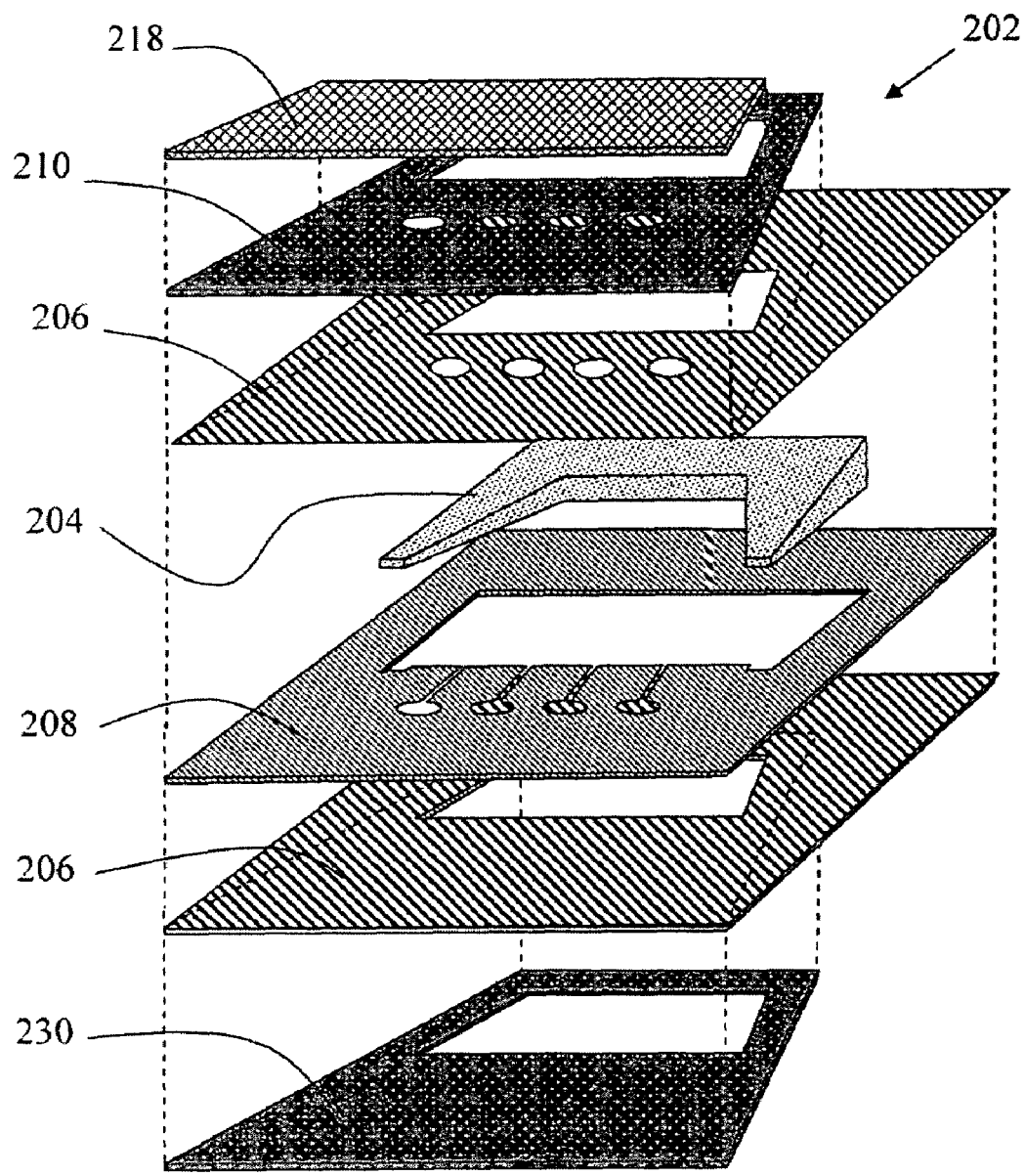
FIG. 9  (Vent, One side)

LIQUID METAL THERMAL INTERFACE MATERIAL SYSTEM

CROSS-REFERENCE TO RELATED APPLICATIONS

The present application is a continuation-in-part of, and claims priority from, U.S. patent application Ser. No. 11/248,720 filed Oct. 11, 2005, and still pending.

TECHNICAL FIELD

This invention relates to the field of heat transfer structures between electronic components and their associated heat exchangers and, more particularly, to a thermal interface system which utilizes a metal alloy interface, materials and design features to stabilize the alloy while exposed to various environmental conditions.

BACKGROUND OF THE INVENTION

Today's electronic components generate significant amounts of heat which must be removed to maintain the component's junction temperature within safe operating limits. Failure to effectively conduct away heat leaves these devices at high operating temperatures, ultimately resulting in decreased performance and reliability and ultimately failure.

The heat removal process involves heat conduction between the electronic component and heat exchanger, or heat sink, via a thermal interface material. Small irregularities and surface asperities on both the component and heat sink surfaces create air gaps and therefore increase the resistance to the flow of heat. The thermal resistance of the interface between these two surfaces can be reduced by providing an interface material which fills the air gaps and voids in the surfaces.

An ideal medium for transferring heat from one surface to another should have low interfacial or contact thermal resistance, high bulk thermal conductivity and the ability to achieve a minimum bond-line thickness. Additional desirable qualities include product stability, ease of deployment, product reworkability, low cost and non-toxicity.

Liquids have low interfacial resistance because they wet a surface forming a continuous contact with a large area. Most liquids do not, however, have very high conductivity. Solids, and in particular metals, have very high conductivity but high interfacial resistance. Most common heat transfer materials combine highly conductive particles with a liquid or plastic in order to exploit both characteristics. Examples of the former are greases and gels while the latter include filled epoxies, silicones and acrylics.

Greases have been developed with thermal conductivities significantly better than the corresponding conductivities of filled adhesives. Typical problems with greases include to pumping and dry out, both of which can cause the conducting medium to lose contact with one or both of the heat transfer surfaces. Pumping occurs when the structure is deformed, due to differential thermal expansion or mechanical loads, and the grease is extruded. The oils, contained in a grease, can be depleted by evaporation or by separation and capillary flow.

Liquid metal alloys (liquid at the operating temperature of the electronic component), such as alloys of bismuth, gallium and indium, potentially offer both low interfacial resistance and high conductivity. Several alloys of gallium with very low melting points have also been identified as potential liquid metal interface materials. Thermal performance of such an interface would be more than one order of magnitude greater than many adhesives typically in use.

Although liquid metal alloys offer both low interfacial resistance and high conductivity, they have historically suffered from various reliability issues including corrosion/oxidation, intermetallic formation, drip-out, dewetting, and migration. Unless mitigated, these mechanisms will continue to degrade the interface, resulting in a thermally related catastrophic failure of the actual electronic component.

The ability to contain an electrically conductive liquid within an electronic package presents significant challenges. The liquid must be reliably retained in the thermal interface throughout the life of the package if shorting is to be avoided and effective resistance is to be minimized. To solve the problems of liquid metal migration, various seal and gasket mechanisms have been disclosed.

Although, these various mechanisms mitigate liquid metal migration, some disclosures include elastomeric or polymeric components in the thermal path which is thermally undesirable. Other disclosures include various seals which increase the bondline thickness (BLT) of the liquid metal, thereby, increasing the bulk thermal resistance of the interface. These elastomeric components are not hermetic and therefore do not prevent air or moisture from entering the thermal joint.

In addition, corrosion will propagate through the thermal interface should any air gaps be present. Surface asperities of the heat source and heat exchanger increase the potential for voids. This is further exacerbated when the metal changes between the liquid and the solid state within the temperature range of the package.

U.S. Pat. No. 4,413,766, granted to Webster on Nov. 8, 1983 discloses a void-free design to bond a metallic sheet to a ceramic substrate wherein grooves are added to the metallic sheet to facilitate gas escape.

U.S. Pat. No. 4,650,107, granted to Keser on Mar. 17, 1987 discloses a design to promote bubble-free soldering of two components wherein V-shaped perforations or mesh facilitate deaerating of the solder joint while using high clamping pressure.

U.S. Pat. No. 4,915,167, granted to Altoz, et al. on Apr. 10, 1990 discloses a low melting point thermal interface material which is contained between the heat source and heat exchanger by applying a sealant to completely encapsulate the exposed interface material.

U.S. Pat. Nos. 5,323,294 and 5,572,404, granted to Layton, et al. on Jun. 21, 1994 and Nov. 5, 1996, respectively, and U.S. Pat. No. 5,561,590, granted to Norell, et al. on Oct. 1, 1996 disclose a heat transfer module in which a compliant, absorbent body containing liquid metal is surrounded by a seal, said body is spaced apart from the seal area. As the module is clamped between a heat source and heat exchanger, liquid metal is squeezed out of the porous structure to fully fill the space within the seal area.

U.S. Pat. No. 5,909,056, granted to Mertol on Jun. 1, 1999 discloses a thermal interface structure in which a phase change thermal interface material is contained within a protrusion on a heat spreader and a dam ring, which is attached to the backside of a semiconductor chip.

U.S. Pat. No. 6,016,006, granted to Kolman, et al. on Jan. 18, 2000 discloses a method for applying thermal interface grease between an integrated circuit device and a cover plate in which a seal encloses the region of the device. Thermal grease is injected into the cavity region via an inlet port in the cover plate thereby filling the interface between device and plate.

U.S. Pat. No. 6,037,658, granted to Brodsky, et al. on Mar. 14, 2000 discloses a heat transfer surface in which a thermally conductive fluid is contained by both an absorbent medium and a seal to inhibit migration.

U.S. Pat. No. 6,097,602, granted to Witchger on Aug. 1, 2000 discloses a thermal interface structure in which a phase change interface material is surrounded by a fabric carrier dike structure. The dike is adhesively attached to both the electronic circuit package and heat sink, thereby preventing interface material from migrating from the joint.

U.S. Pat. Nos. 6,281,573 and 6,656,770, granted to Atwood, et al. on Aug. 28, 2001 and Dec. 2, 2003, respectively, disclose both a solder-based seal (between the ceramic cap/heat exchanger and package substrate) and an elastomeric gasket (between the ceramic cap/heat exchanger and chip) to "near hermetically" seal the cavity containing a Gallium alloy liquid metal interface material and thereby limit oxidation and migration.

U.S. Pat. No. 6,292,362, granted to O'Neal, et al. on Sep. 18, 2001 discloses a thermal interface material module in which a flowable interface material is deposited in the center opening of a picture-frame carrier and a gasket is mounted to the carrier. With the application of heat, the reservoir area between the interface material and gasket is filled.

U.S. Pat. No. 6,665,186, granted to Calmidi, et al. on Dec. 16, 2003 discloses a liquid metal interface material held in place by a flexible seal, such as an O-ring, which also accommodates expansion and contraction of the liquid. The seal also allows for air venting and filling of liquid metal.

U.S. Pat. No. 6,732,905, granted to Humpston, et al. on May 11, 2004 discloses a method for void-free component attachment wherein a thru-hole vent is formed in the backside face of one component.

U.S. Pat. Nos. 6,761,928, 6,617,517, 6,372,997, granted to Hill, et al. on Jul. 13, 2004, Sep. 9, 2003, and Apr. 16, 2002, respectively, and U.S. Pat. No. 6,940,721, granted to Hill on Sep. 6, 2005 disclose a low melting point alloy coating both sides of a surface enhanced metallic foil, thereby providing a carrier to support and contain the liquid metal alloy. The low melt alloy on the foil carrier, placed between a heat source and heat exchanger, will become molten during the operational temperatures of the heat source.

U.S. Pat. No. 6,849,941, granted to Hill, et al. on Feb. 1, 2005 discloses a liquid metal interface material in which the material is bonded (in solid form) to a solid base member and includes a sealing material set into a annular groove (within the base member) surrounding the periphery of the bonded interface.

U.S. Pat. No. 6,891,259, granted to Im, et al. on May 10, 2005 and U.S. Pat. Application No. 20030085475, filed by Im, et al. on Oct. 10, 2002 disclose a semiconductor package in which a dam substantially surrounds the thermal interface material. The package lid includes injection holes for the dispensation of the dam and interface material.

U.S. Pat. No. 7,030,485 and U.S. Pat. Application No. 20060138644, both by Houle, et al., granted on Apr. 18, 2006 and filed on Feb. 23, 2006, respectively, disclose the use of a plastically deformable material (indium, tin, etc.) to create channels or guides between a IC chip and heat spreader. A liquid metal, such as Gallium, fills the spaces/channels and may even be circulated.

U.S. Pat. No. 7,169,650 and U.S. Pat. Application No. 20030173051, both by Rinella, et al. granted on Jan. 30, 2007 and filed on Mar. 12, 2002, respectively, disclose a method of forming a thermal interface in which a semi-solid metal, injected through an inlet on a heat spreader plate, fills the gap between a die and the cavity formed in the heat spreader plate.

U.S. Pat. Application No. 20030183909, filed by Chiu on Mar. 27, 2002 discloses a method of forming a thermal interface in which a thermal interface material is dispensed through and inlet in a heat spreader in order to fill the interface between the spreader and chip.

U.S. Pat. Application No. 20040217467, filed by Rumer, et al. on May 28, 2004 discloses a heat spreader comprised of a convex or concave surface which contacts a thermal interface material (between chip and heat spreader) in order to mitigate stress from thermal expansion and contraction.

U.S. Pat. Application No. 20040261980, filed by Dani, et al. on Jun. 30, 2003 discloses a heat dissipating device, such as a heat spreader, comprised of surface features (channels, grooves, serrations) to facilitate adhesion of a thermal interface material and arrest interface cracking or delamination.

U.S. Pat. Application No. 20040262766, filed by Houle on Jun. 27, 2003 discloses a liquid metal interface contained within a cold-formed o-ring barrier positioned directly on the chip. Once the barrier is established between the heat spreader and chip, liquid metal is introduced into the interface via a channel in the spreader.

U.S. Pat. Application No. 20050073816, filed by Hill on Jan. 7, 2004 discloses a liquid metal interface assembly in which an o-ring or shim sealing member surrounds the liquid metal interface material to shield the interface from the atmosphere.

U.S. Pat. Application No. 20060131738, filed by Furman, et al. on Sep. 6, 2005 discloses a liquid metal layer with diffusion barrier layers on both interface surfaces and a wetting layer over each barrier layer. The liquid metal may also include metallic or inert particles for viscosity modification.

FIGS. 1A through 3 (Prior Art) show various methods of forming a void-free, high thermal performance thermal interface within electronic assemblies 100. FIG. 1A illustrates an electronic assembly 100 comprised of a thermal interface structure 102 positioned between a heat spreader lid 104 and electronic component 106, which is comprised of an IC chip 108, package substrate 110 and electrical interconnection vias 112. The interface structure 102 is comprised of a metallic core 120 encapsulated by a metallic interface composition 122. An adhesive layer 114 bonds the heat spreader lid 104 to the electronic component package substrate 110. It can be seen in FIG. 1B that the lid 104 has now been mounted to the package substrate 110 with an adhesive layer 114 located on the lid flange 116. During operation of the electronic component 106, the resultant heat will cause excess metallic interface composition 122 to flow out of the thermal interface, thereby creating a fillet outside the IC chip perimeter. Unfortunately, oxidation, present on the surface of the metallic interface composition 122 prior to heating and flowing, creates a "skin" and prohibits filling of the surface asperities present on the lid 104 and IC chip 108. FIG. 1c, a magnified sectional view of FIGS. 1a and 1b, illustrates the resultant air gaps 123 due to the layer of oxidation 125 inhibiting flow of interface material. The non-hermetic interface allows oxygen and moisture to penetrate into these air gaps 123 and continue oxidation/corrosion of the metallic interface composition 122 within the interface between chip 108 and lid 104.

Within FIG. 2 (Prior Art), it can be seen that a metallic thermal interface composition is injected (by a dispenser 124) through a hole 126 in the heat spreader lid 104 to yield a filled thermal interface joint 128. Without a barrier or seal, interface material would have the tendency to migrate out of the joint. The use of a seal will promote full filling of the thermal joint as well. Additionally, the hole 126, filled with the interface composition would certainly possess lower thermal conductivity than the typical materials (copper, aluminum) comprising heat spreader lids.

FIG. 3 (Prior Art), similar to FIG. 2, illustrates an electronic assembly 100 comprised of a thermal interface structure 130 sandwiched between an IC chip 108 and heat spreader lid 104. The lid 104 includes at least one gas permeable plug 132 located within holes 134 in the lid 104. A barrier or seal 136 is placed near the perimeter of the IC chip 108, thereby creating a seal and space between the lid 104 and IC chip 108. Liquid interface material 138 is injected into the holes 134 in the lid 104, thereby filling the space comprising the thermal interface joint. Should the barrier be of polymeric composition, heat transfer would be reduced near the perimeter of the chip. A metallic barrier would require a bonding and hermetic seal in order for the gas permeable plugs to be effective. Barrier bonding may induce unwanted stresses between the IC chip 108 and the lid 104. Additionally, the holes 134 in the lid would also created undesirable thermal impedance between the chip 108 and lid 104.

SUMMARY OF THE INVENTION

Accordingly, it is the overall feature of the present invention to provide an improved thermal interface system in order to more effectively transfer thermal energy from an electronic component to a heat exchange structure.

An additional feature of the present invention is to provide an improved metal thermal interface system which is liquid over the operating temperature of the electronic component, thereby minimizing the stresses placed on the electronic component by the heat exchange structure.

Yet, another feature of the present invention is to provide a corrosion resistant interface system in which the metallic interface composition flows and fills the surface asperities on both the electronic component and heat exchanger thereby sealing the interface from moisture and oxygen.

One additional feature of the present invention is to provide an improved metal thermal interface system in which the metallic interface composition directionally flows to mitigate any entrapped air voids within the thermal interface.

A further feature of the present invention is to provide an improved metal thermal interface system which includes structures to vent entrapped air between the electronic component and heat exchanger, thereby increasing heat transfer and environmental reliability.

Still another feature of the present invention is to provide an improved metal thermal interface system which includes structures to accommodate excess metallic interface material during deployment, thereby ensuring a minimum interface thickness for maximum thermal performance.

One additional feature of the present invention is to provide a metallic interface composition including oxygen gettering elements to promote wetting to oxide layers present on the surface of the electronic component chip and heat exchanger.

Lastly, it is a feature of the present invention to combine all of these unique design aspects and individual fabrication techniques into effective and manufacturable thermal interface system for electronic components, including Flip Chip integrated circuit (IC) packages.

BRIEF DESCRIPTION OF THE DRAWINGS

FIG. 9, an isometric view, illustrates a vent structure (which is gas permeable, yet liquid impermeable) to expel entrapped air during deployment of the present invention.

DETAILED DESCRIPTION OF THE INVENTION

Figure 1A:
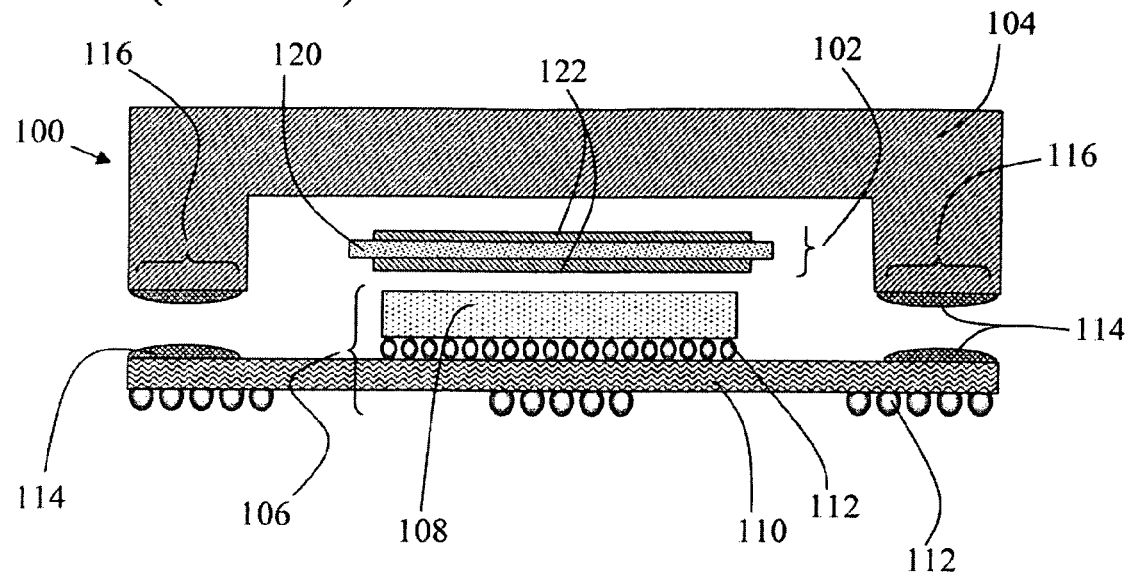
FIGS. 1a through 1c, sectional views, illustrate an electronic assembly including a foil-based thermal interface structure deployed between an IC chip and heat spreader lid, as known in the art.
Figure 1B:
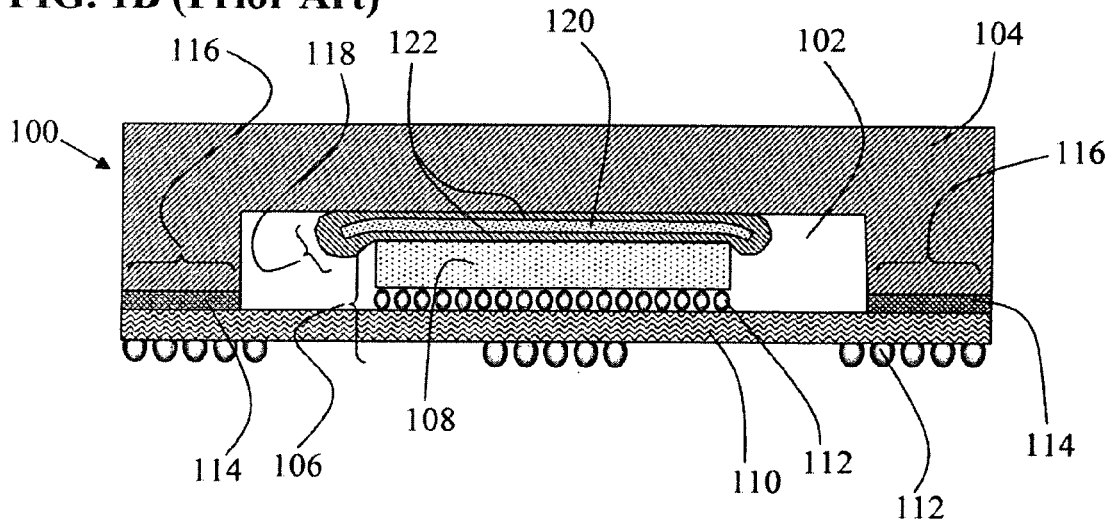
Figure 1C:
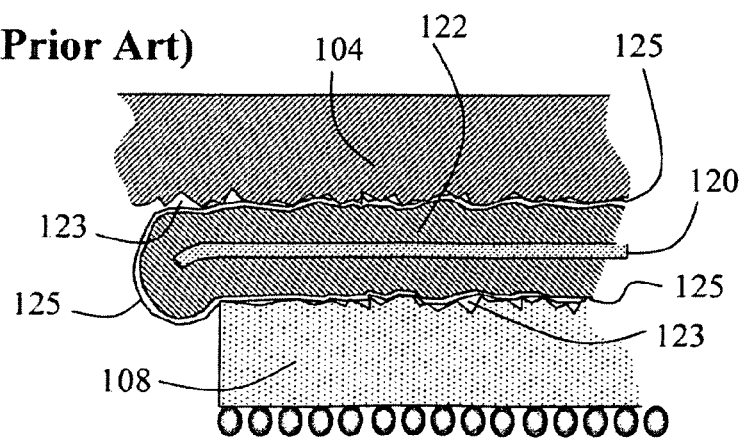
Figure 2:
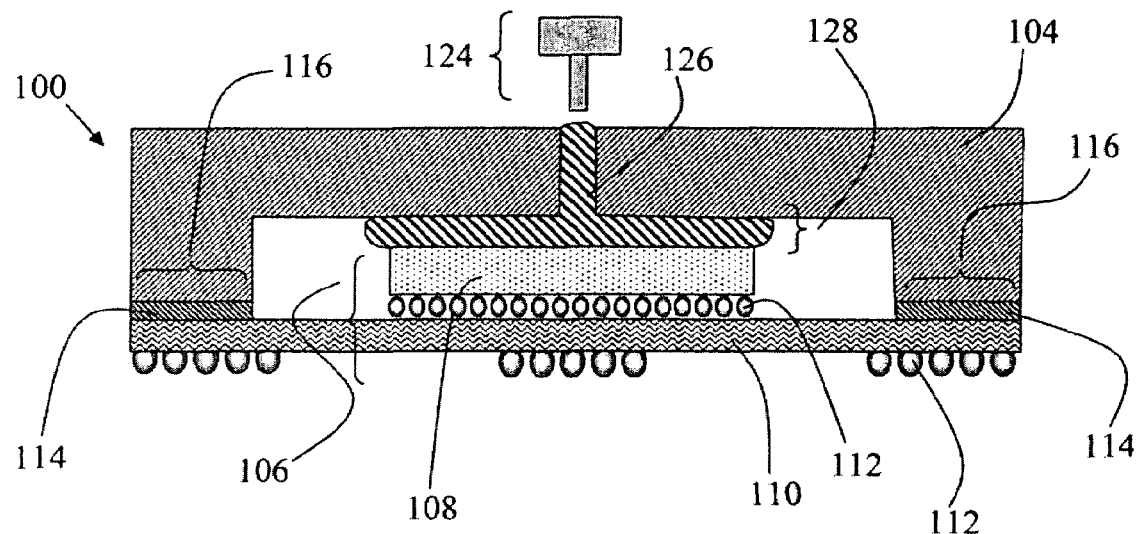
FIG. 2, a sectional view, illustrates an electronic assembly in which thermal interface material is injected through a hole in the heat spreader lid, as known in the art.
Figure 3:
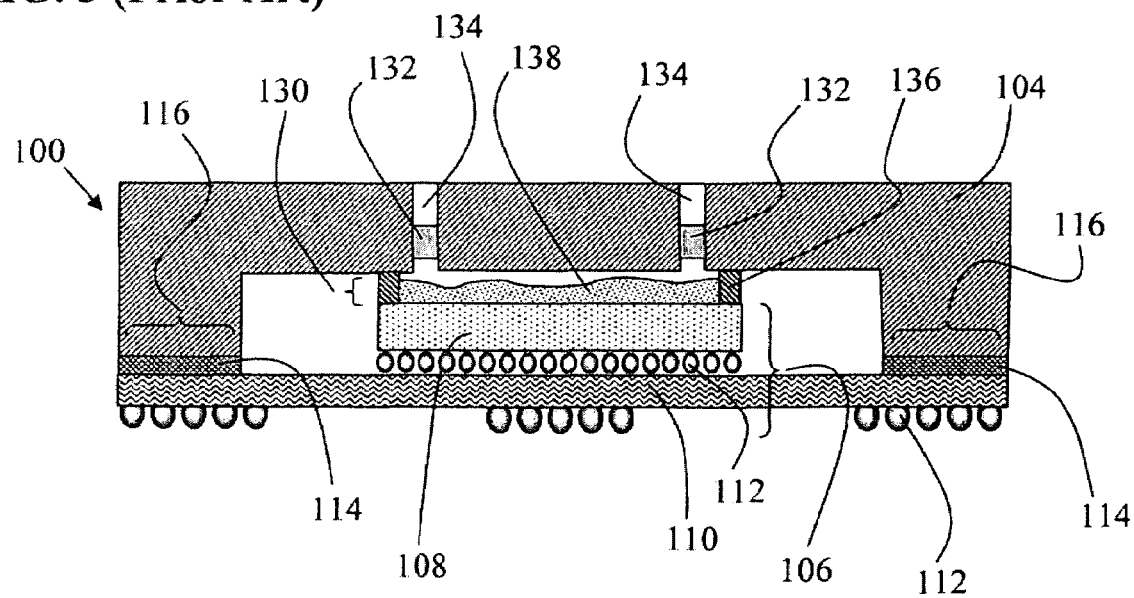
FIG. 3, a sectional view, illustrates an electronic assembly in which thermal interface material is added though a vent to fill the space inside of a barrier formed between the IC chip and lid, as known in the art.

FIGS. 4a through 4d illustrate a sequence of the present invention in which the thermal interface structure 140 flows and fills the space between the electronic component and heat exchanger to yield a highly conductive and hermetic thermal interface joint. An electronic assembly 100 includes a heat exchanger 104 (depicted as a heat spreader lid), a thermal interface structure 140 positioned between the lid 104 and an electronic component 106. The component 106 is comprised of an IC chip 108, package substrate 110 and electrical interconnection vias 112 (on the chip 108 and substrate 110).

Figure 4A:
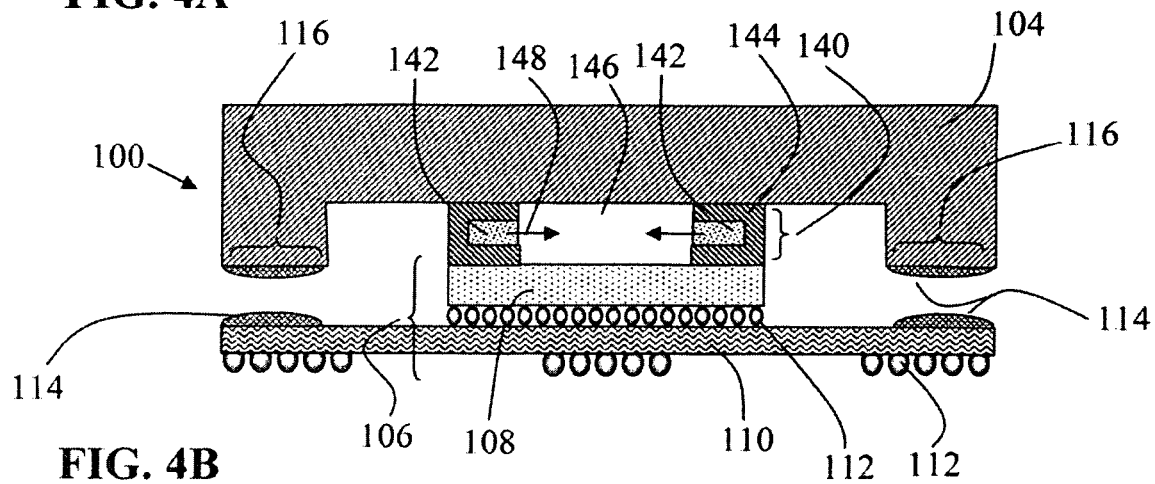
FIGS. 4a through 4d, sectional views, illustrate the sequence of flowing, filling, and sealing of metallic interface material within a thermal interface joint of the present invention.

Within FIG. 4a, a thermal interface structure 140 includes a metallic seal member 142 (comprised of an inner and outer perimeter) which is positioned near the perimeter of the IC chip 108 and is comprised of a metallic interface composition. It can be seen that the metallic seal member 142 does not extend beyond the periphery of the IC chip 108. A coating layer 144 encapsulates the metallic seal member on all faces with the exception of the inner perimeter of the member 142. The coating layer 144 may be of metallic or polymeric composition.

The interface structure 140, when disposed between the lid 104 and IC chip 108, creates an interface space 146 between the electronic component and heat spreader and a seal to each of their respective surfaces. With the application of heat (from the electronic component 106 or external source), the metallic seal member 142 will flow (flow arrows 148) into the space 146 and fill all the surface asperities of both heat spreader lid and IC chip.

Figure 4B:
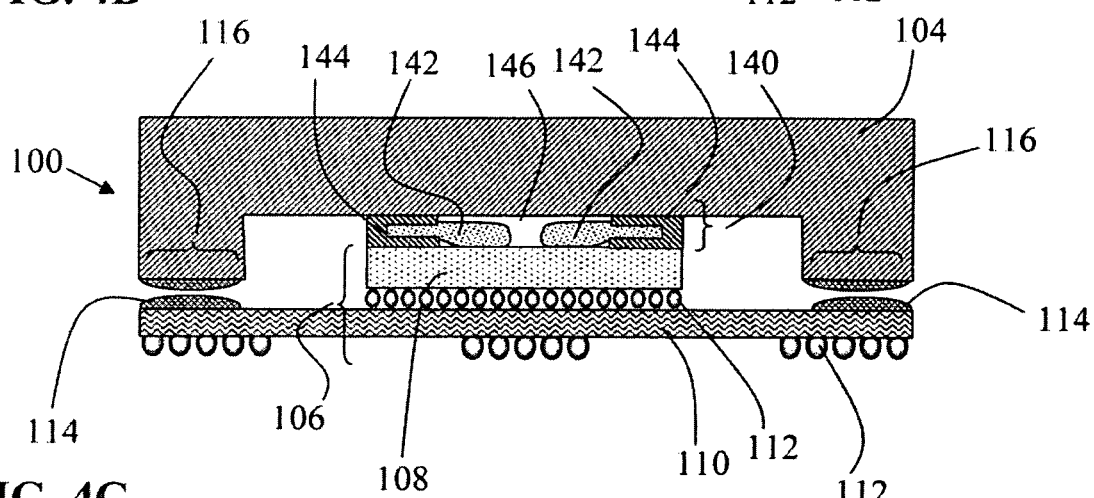

FIG. 4b illustrates the melting and flowing of the liquefied metallic interface composition comprising the metallic seal member 142. Pressure applied external to the lid 104 or the weight of the heat exchanger 104 also promotes the flowing of the liquefied metallic seal member 142 and filling of the interface space 146. As the seal member 142 continues to melt, the space 146 between the lid 104 and IC chip 108 is reduced in volume.

Figure 4C:
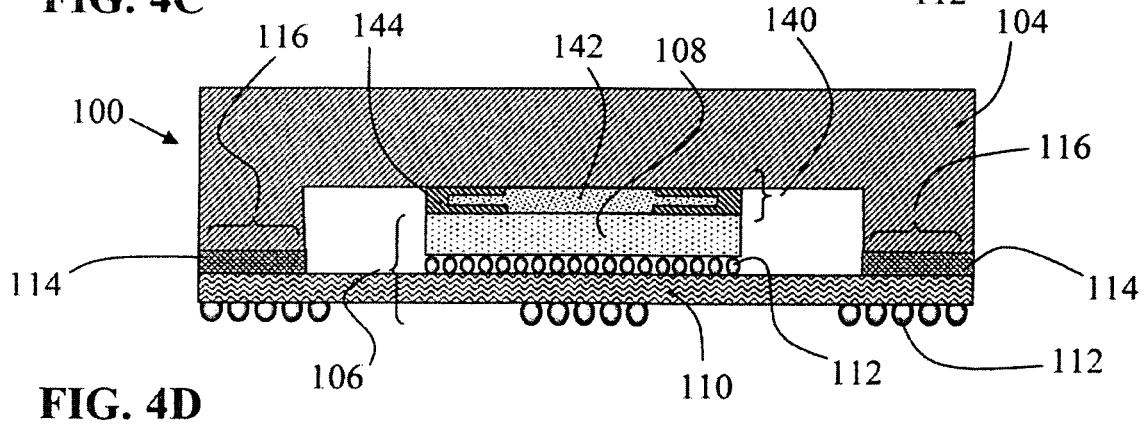

As seen in FIG. 4c, the interface space 146 between the lid 104 and IC chip 108 has been fully filled with the metallic interface composition, comprising the metallic seal member 142. The coating layer 144 assists in containing the flowing interface composition within the perimeter of the metallic seal member 142. Due to the collapse of the metallic seal member 142 during melting, the adhesive layer 114, applied to the heat spreader lid 104 at the outer lid flange 116 and package substrate 110, is now bonded to the electronic component package substrate 110. Seal materials include silicones, polysulphides, polyurethanes, polyimides, polyesters, epoxides, cyanate esters, olefins and sealing glasses. A continuous seal may be applied between the heat spreader lid flange 116 and package substrate 110, thereby reducing the amount of moisture ingression within the lid cavity.

Figure 4D:
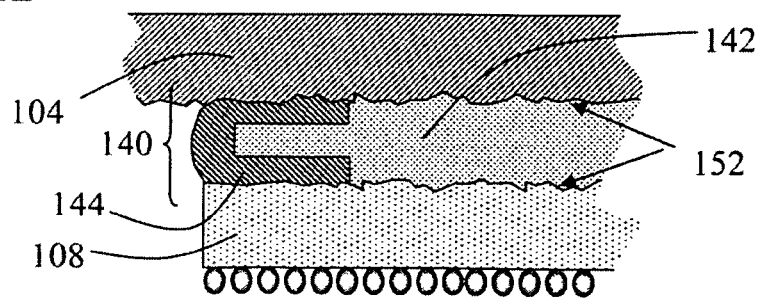

FIG. 4d, a magnified view of FIGS. 4a through 4c, illustrates the filling of surface asperities 152 present on the IC chip 108 and heat spreader lid 104. To enhance heat transfer, an asperity filling material, such as a grease or phase change polymeric compound, may be disposed on the coating layer where it contacts either the IC chip or heat exchanger.

The metallic interface composition (comprising the metallic seal member 142) may be comprised of the metallic elements of bismuth, gallium, indium and tin and their alloys.

It is desirable for the composition to be liquid over the operating temperature of the electronic component (<100° C.). This allows the metal to adequately flow into all surface asperities of the heat spreader lid 104 and IC chip 108 and accommodate thermomechanical stresses from temperature cycling.

In another embodiment of the present invention, "reactive" elements or intrinsic oxygen gettering elements are added to the metallic interface composition to further facilitate wetting to the lid 104 and IC chip 108. The resulting composition has a higher affinity for surface oxides and promotes oxide to oxide bonding, thereby reducing the thermal impedance at the lid 104 and chip 108 contact interfaces. Oxygen getter elements include alkali metals (Li, Na, and K), alkaline-earth metals (Mg and Ca), zinc, refractory metals (Ti, Zr, Hf, Ta, V, and Nb), rare earth metals (La, Ce, Pr, Nd, Sm, Eu, Gd, Tb, Dy and Yb), and mixtures and alloys thereof.

FIGS. 5a and 5b through 7a and 7b illustrate a sequence of interface deployment and formation of a metallic interface structure 202 within an electronic assembly 200 of the present invention. Unlike the deployment illustrated in FIGS. 4a through 4d, the thermal interface structure 202 is deployed between the heat spreader lid 104 and heat exchanger or heat sink 168. Therefore, the electronic component 198 is comprised of an IC chip 108, package substrate 110, electrical interconnection vias 112 (on the chip 108 and substrate 110), heat spreader lid 104 and a thermal interface material 155 between the IC chip 108 and lid 104.

Figure 5A:
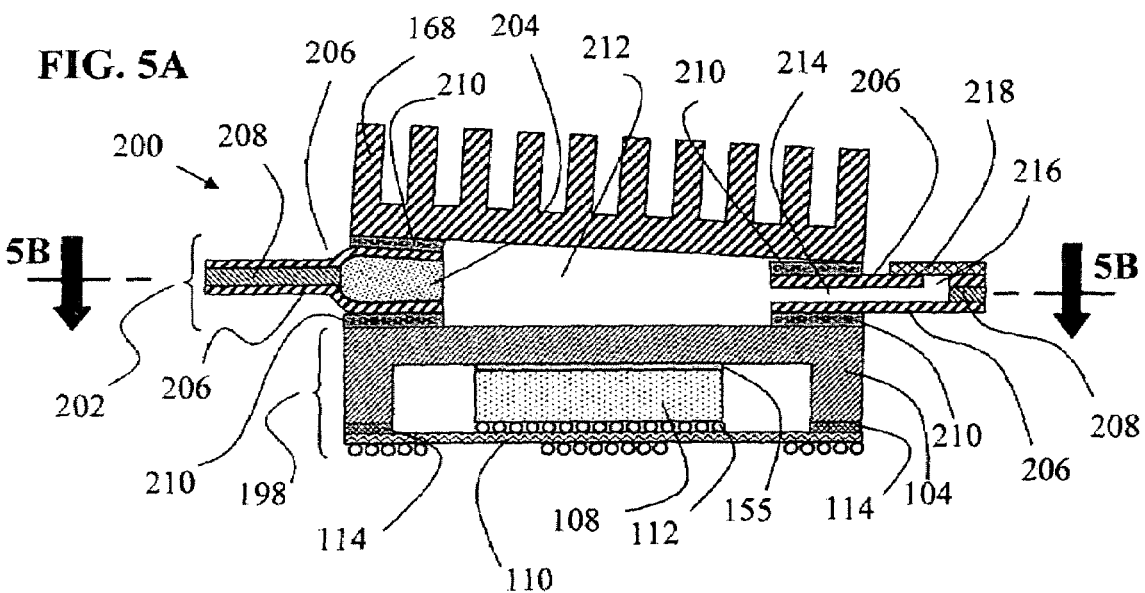
FIGS. 5a and 5b, sectional views, illustrate the initial deployment of one metallic thermal interface embodiment of the present invention.
Figure 5B:
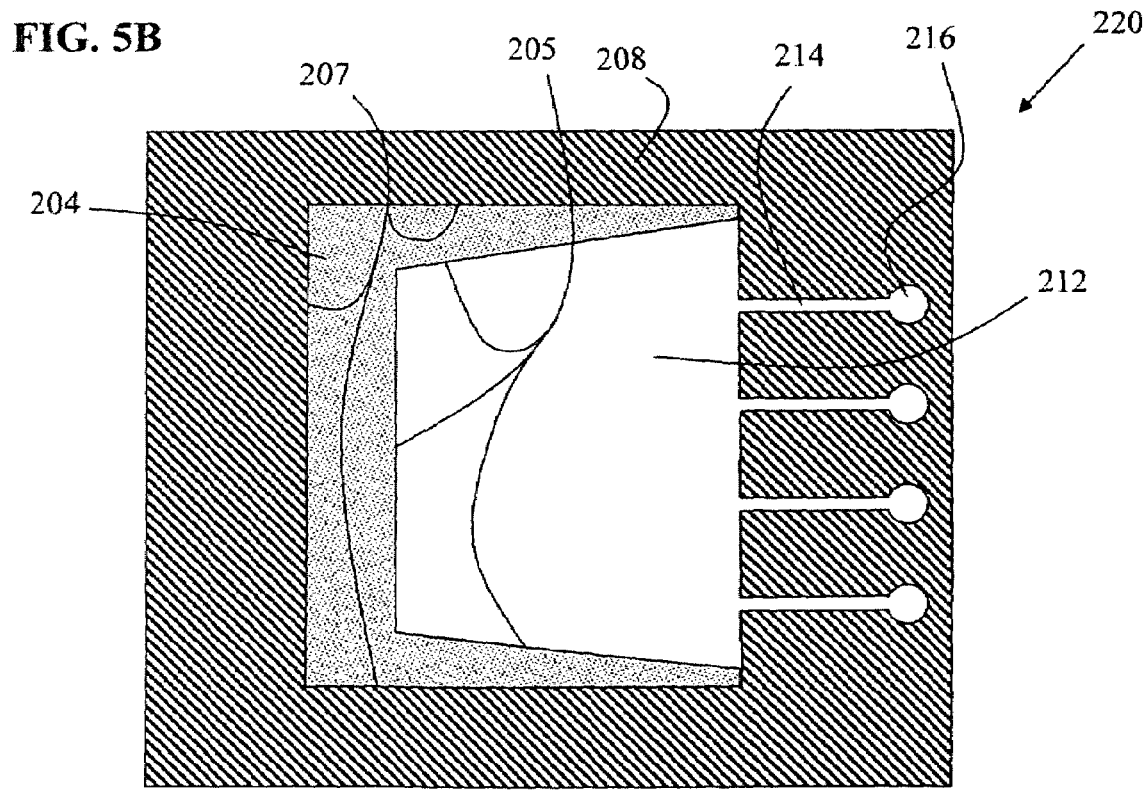

Within FIGS. 5a and 5b (a sectional structure 220 of FIG. 5a on lines 5b-5b), it can be seen that a thermal interface structure 202 (of the present invention) is sandwiched between an electronic component 198 and heat exchanger 168, thereby forming an electronic assembly. A metallic interface composition 204, positioned near the periphery of the electronic component 198, includes at least one inboard face 205 (facing toward the center of the electronic component 198) and at least one outboard face 207 (facing toward the perimeter of the electronic component 198).

An encapsulating structure (comprised of cover layers 206, a duct layer 208 and coating layers 210) and metallic interface composition 204, create a seal (and resultant space 212) between the electronic component 198 and heat exchanger 168. The seal includes an inner perimeter (as illustrated by the space 212 formed between the electronic component 198 and heat exchanger 168) and outer perimeter, illustrated by the region extending laterally from the surfaces which the coating layers 210 contact the electronic component 198 and heat exchanger 168. The coating layers 210 may be adhesive to further facilitate sealing.

It can be seen that the metallic interface composition 204 is encapsulated (by cover layers 206, duct layer 208 and coating layers 210) with the exception of the inboard face 205 of the metallic interface composition 204. The sandwiching of the duct layer 208 (between the cover layers 206) and encapsulation will facilitate the flow of liquefied metallic interface material into the space 212. Vents comprised of ducts 214, vent apertures 216 and an optional vent screen structure 218 connect the space 212 (defined by the seal inner perimeter) to the region beyond the outer perimeter of the seal. An air permeable, liquid impermeable vent screen structure 218 may be added to seal the vent aperture 216.

FIGS. 5a and 5b also illustrate a metallic interface composition 204 which is applied around the perimeter of the electronic component in a non-uniform manner. Additionally, the asymmetry illustrates a disproportionately large quantity of interface composition 204 positioned (on the electronic component) opposite the vents (comprised of ducts 214 and vent apertures 216). In the present embodiment of the invention, this asymmetry of the interface composition 204 (and resultant interface structure 202) creates a space between the heat exchanger 168 and electronic component 198 (prior to liquefaction of the metallic interface composition 204) which is in the form of a trapezoid having its narrow most dimension at the vent side of the structure 202. Combined with the lack of encapsulation on at least one inboard face 205 of the interface composition 204, the asymmetric (disproportionately large quantity of) metallic interface composition 204 facilitates a directional flow (when liquefied) toward the vents (comprised of apertures 216), resulting in the mitigation of entrapped air during deployment.

Figure 6A:
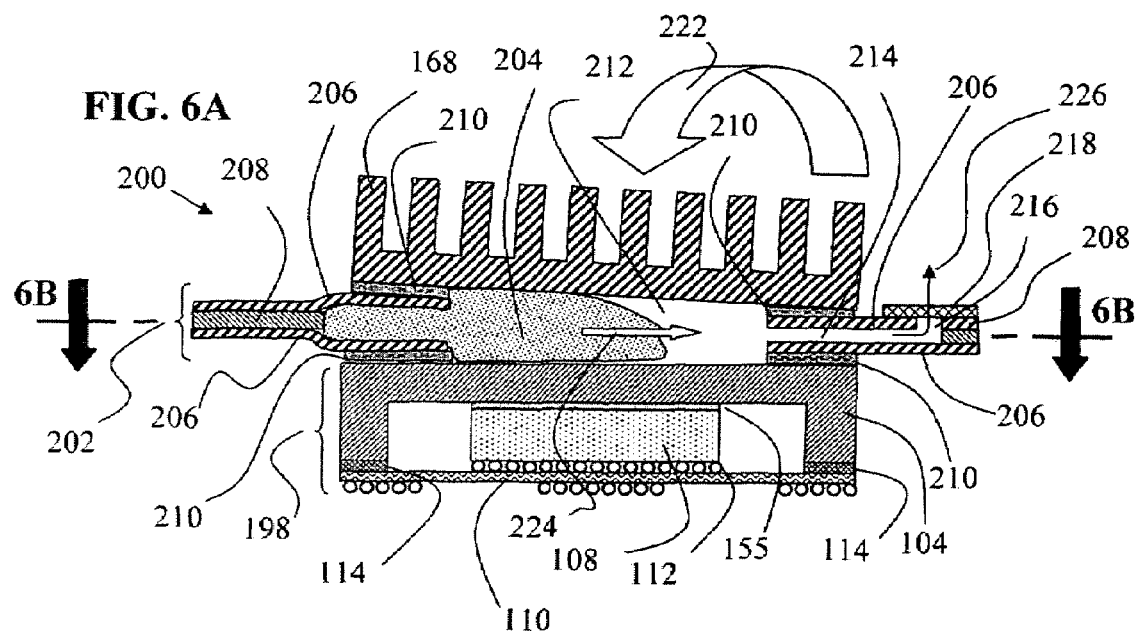
FIGS. 6a and 6b, sectional views, illustrate the flowing and filling of metallic interface material (between an electronic component and heat exchanger) of the present invention.
Figure 6B:
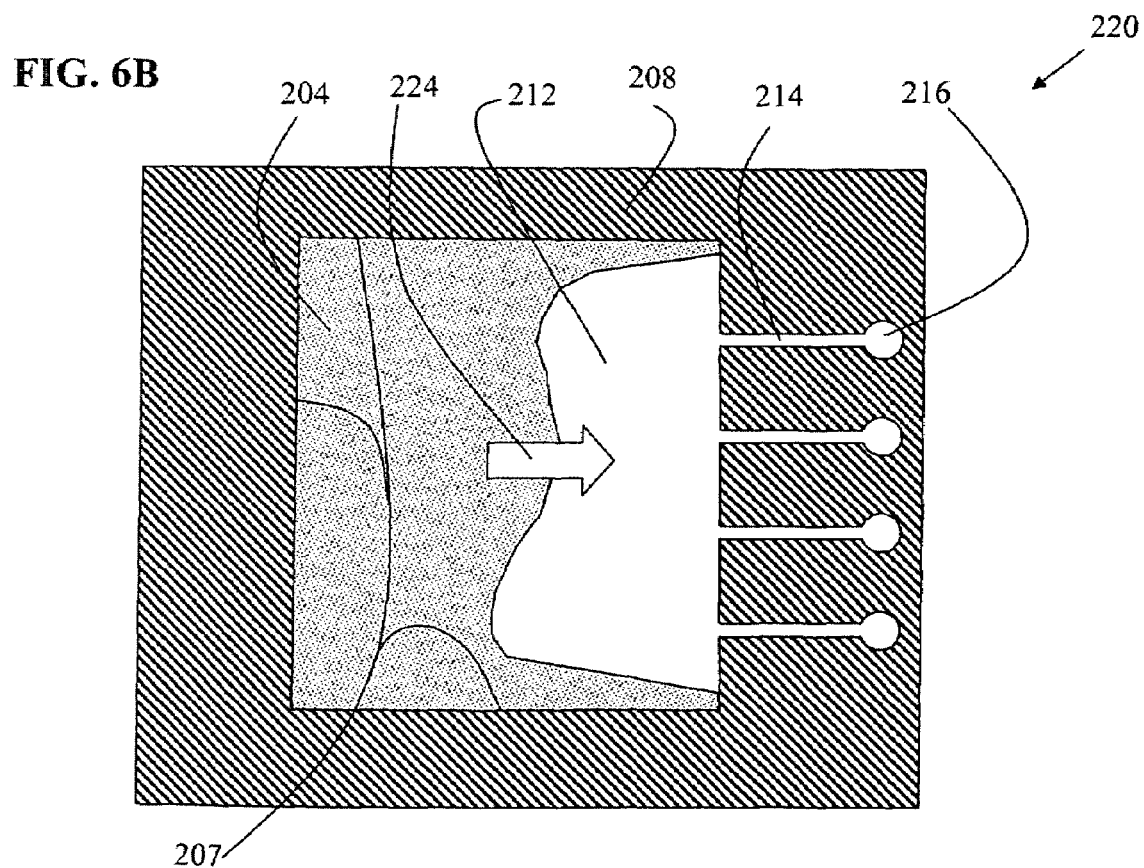

Now, within FIGS. 6a and 6b (a sectional structure 220 of FIG. 6a on lines 6b-6b), a compressive force 222 and thermal energy are applied to the metallic interface structure 202, resulting in the liquefaction and subsequent dimensional change of the metallic interface composition 204. With continued liquefaction (and collapse of the structure 202), the composition 204 will flow directionally 224 toward the ducts 214 and vent apertures 216, thereby forcing air 226, originally entrapped within the space 212, to be expelled through the vent screen 218 via the vent apertures 216. The flowing composition 204 flows into the space 212 and fills the surface asperities of both electronic component 198 and heat exchanger 168. As the composition continues to liquefy, the space 212 between component 198 and exchanger 169 is reduced in volume.

Figure 7A:
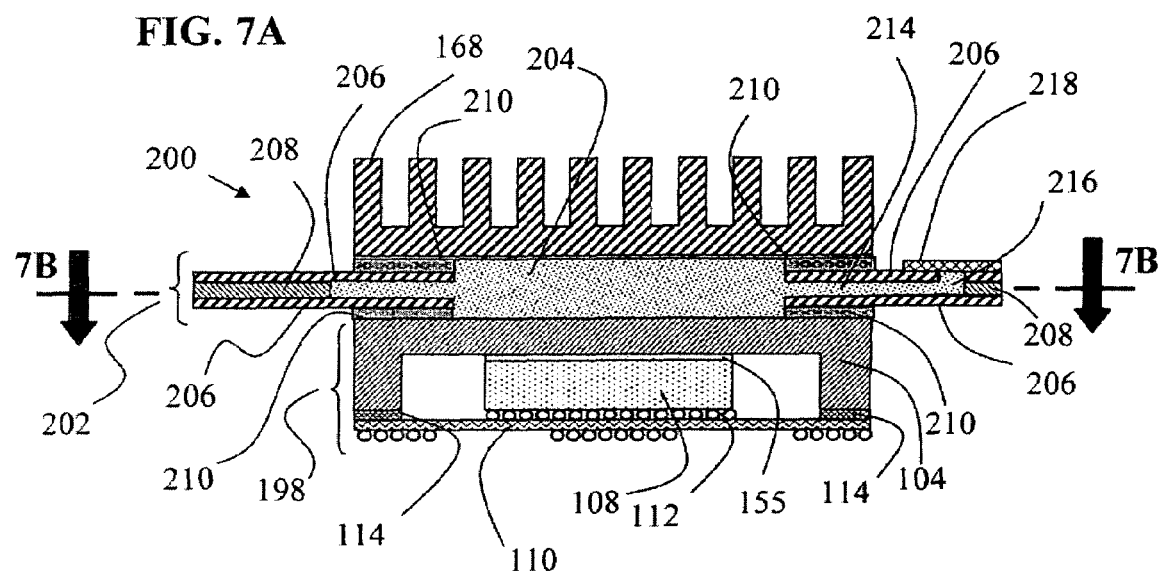
FIGS. 7a and 7b, sectional views, illustrate final deployed state of one metallic thermal interface embodiment seen in FIGS. 5a, 5b, 6a and 6b.
Figure 7B:
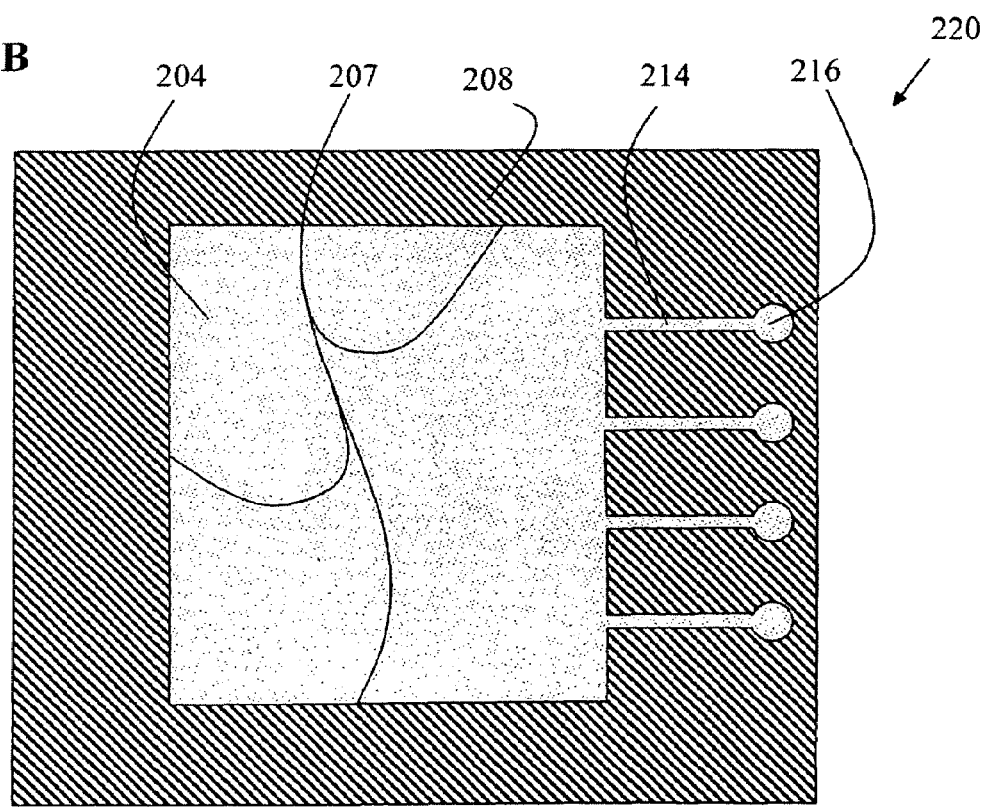

As seen in FIGS. 7a and 7b (a sectional structure 220 of FIG. 7a on lines 7b-7b), the interfacial space 212 (inner perimeter region of the seal) has been fully filled with the metallic interface composition 204. The ducts 214 and vent apertures 216 may also be filled with the composition 204; however, the vent screen structure 218 prohibits the passage of liquefied composition 204 to the outer perimeter region of the seal. With the complete liquefaction and flow of the interface composition 204, it can also be seen that the heat exchanger 168 is now relatively planar with the electronic component 198.

Figure 8A:
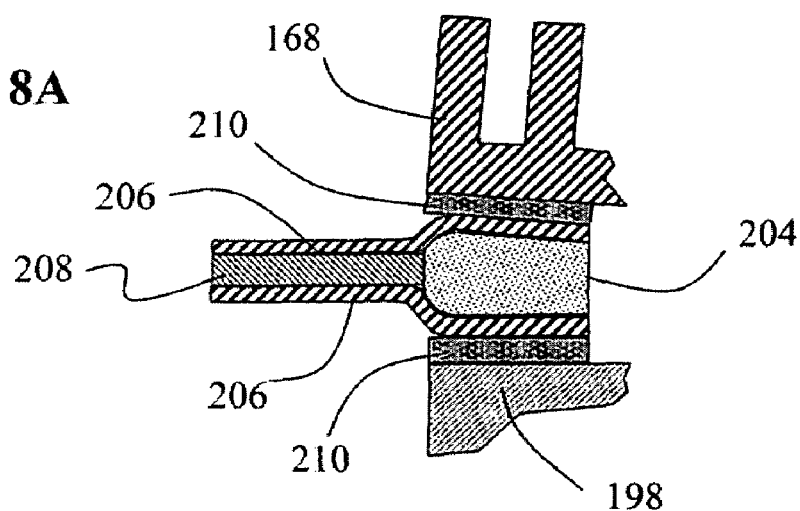
FIGS. 8a through 8c, partial sectional views, illustrate the change of interface structure thickness to lateral dimensional change as the metallic interface structure (of the present invention) is fully deployed.
Figure 8B:
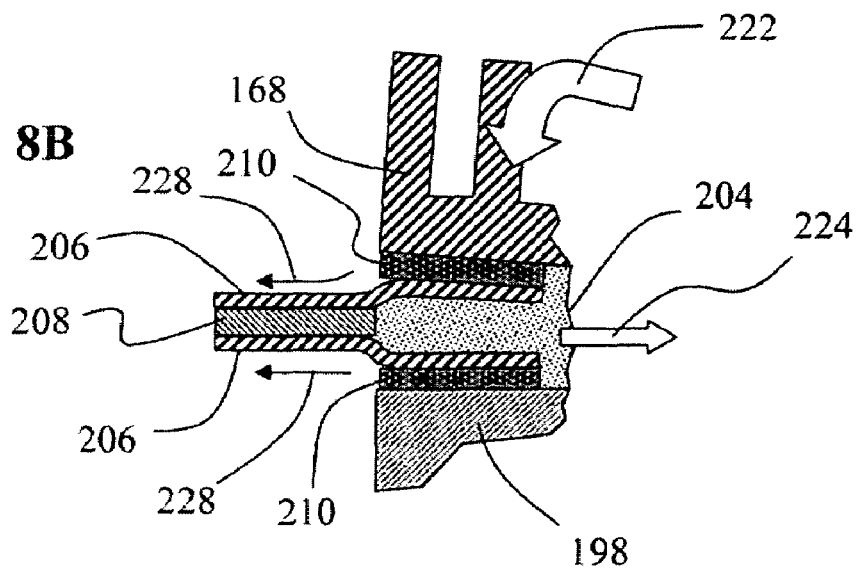
Figure 8C:
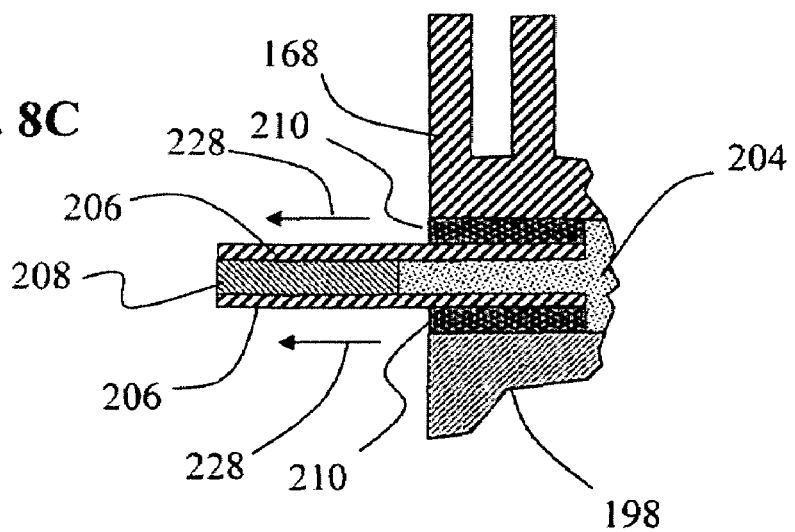

FIGS. 8a through 8c, magnified sectional views of the interface structure 202 (of FIGS. 5 through 7) between an electronic component 198 and heat exchanger 168, illustrate the dimensional changes (on the structure 202) which result from liquefaction of the interface composition and compressive loading.

FIG. 8a illustrates cover layers 206 formed over the metallic interface composition 204 (in solid form) with a duct layer 208 and coating layers 210 comprising the seal.

Within FIG. 8b, it can be seen that with the liquefaction of the metallic interface composition 204 (and compressive force 222), a dimensional change results in a flow 224 of the composition 204 and reduction of the interfacial space thickness (between the component 198 and exchanger 168). As the interface composition 204 liquefies, flows and thins, the formed cover layers 206 (a portion of the encapsulating structure) will change shape by extending laterally 228.

Now, FIG. 8c, illustrates the completion of interface composition 204 flow and filling of the interfacial space. By fully extended laterally 228, the cover layers 206 (a portion of the encapsulating structure) enable the interfacial structure 202 to fully collapse without wrinkles or creases, thereby reducing thermal impedance through the interface composition thickness.

FIG. 9 (an isometric view) illustrates the assembly of individual layers to yield a complete thermal interface structure 202 embodiment of the present invention as illustrated in FIGS. 5 through 8. In this embodiment, the coating layers 210 may be adhesive which facilitates the bonding of the vent screen layer 218 and attachment of the structure 202 to the component 198 and/or heat exchanger 168. The duct layer 208 may be a solid transfer adhesive to facilitate bonding to the cover layers 206. It can also be seen that the metallic interface composition 204 has at least one tapered dimension.

Figure 10:
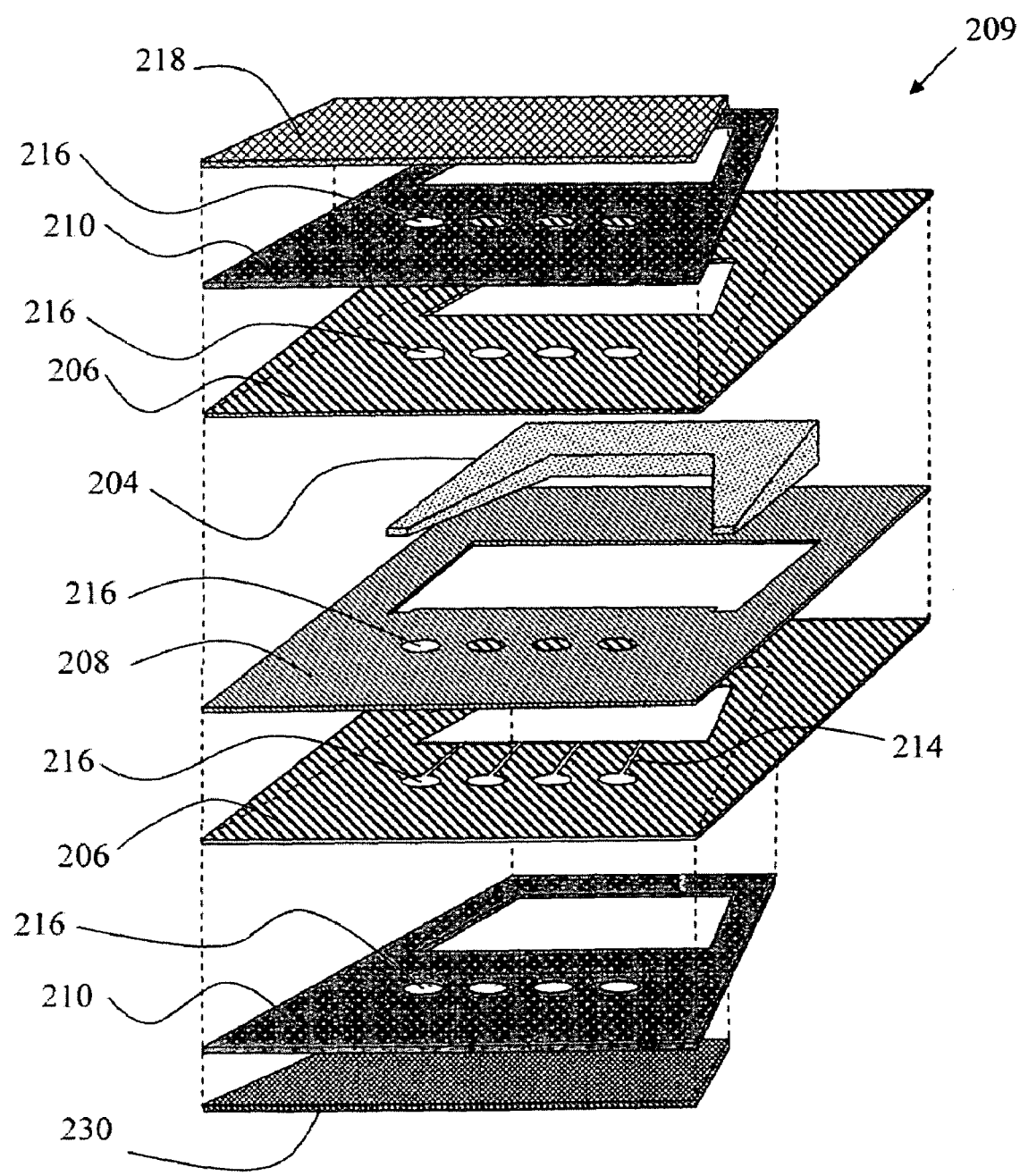
FIG. 10, an isometric view, illustrates another embodiment of the present invention in which a diaphragm structure is added to accommodate excess metallic interface material during deployment.
Figure 11A:
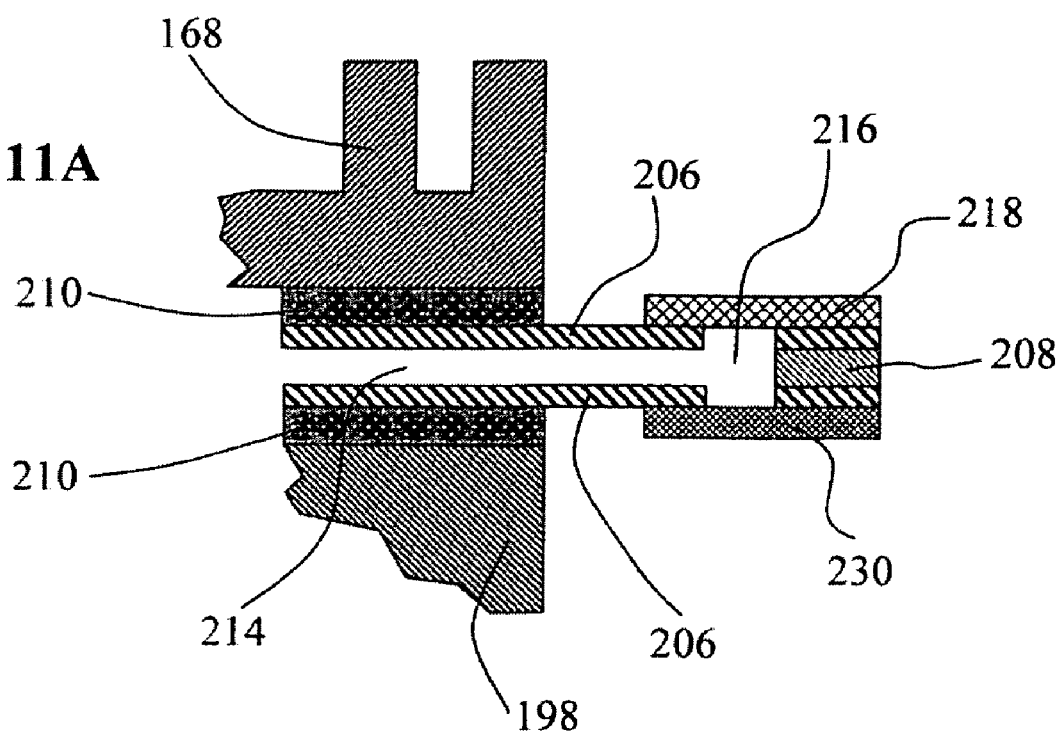
FIGS. 11a and 11b, partial sectional views, illustrate how the diaphragm layer acts as a reservoir for excess metallic interface material.
Figure 11B:
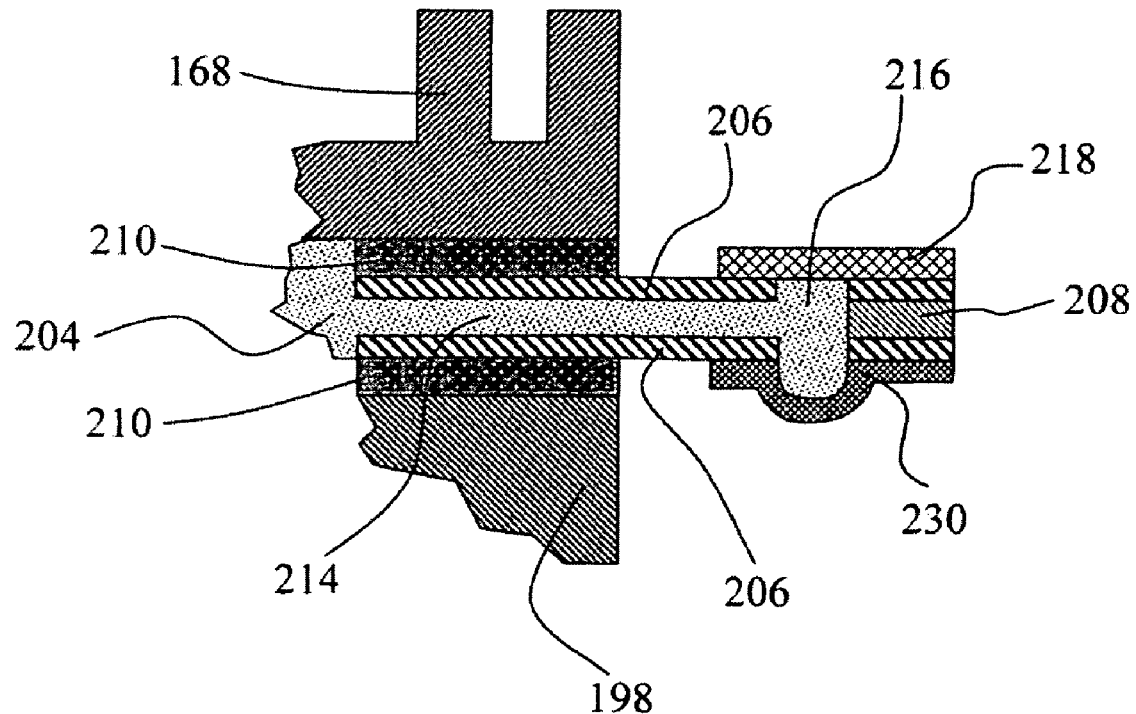

As seen in FIG. 10 (an isometric view) and FIGS. 11a and 11b (partial sectional views), the embodiment illustrated in FIG. 9 includes a diaphragm layer 230 (which may be adhesively attached to the coating layer) which acts as an adjustable reservoir to accommodate excess metallic interface composition 204 during liquefaction and deployment. It is desirable to minimize the interface composition thickness (and thereby reduce the thermal impedance), accommodate differences of surface planarity and roughness between various components and heat exchangers, and eliminate migration of the interface composition 204 while liquid. The elastic diaphragm layer 230 adjusts to changing interface composition volumes while providing necessary back pressure to keep the interface composition 204 within the interfacial space (between the electronic component 198 and heat exchanger 168).

As the liquefied interface composition 204 continues to flow through the ducts 214 and into the vent apertures 216, the diaphragm layer 230 will stretch immediately adjacent each filled aperture 216, thereby creating an adjustable reservoir for excess interface composition 204.

Figure 12:
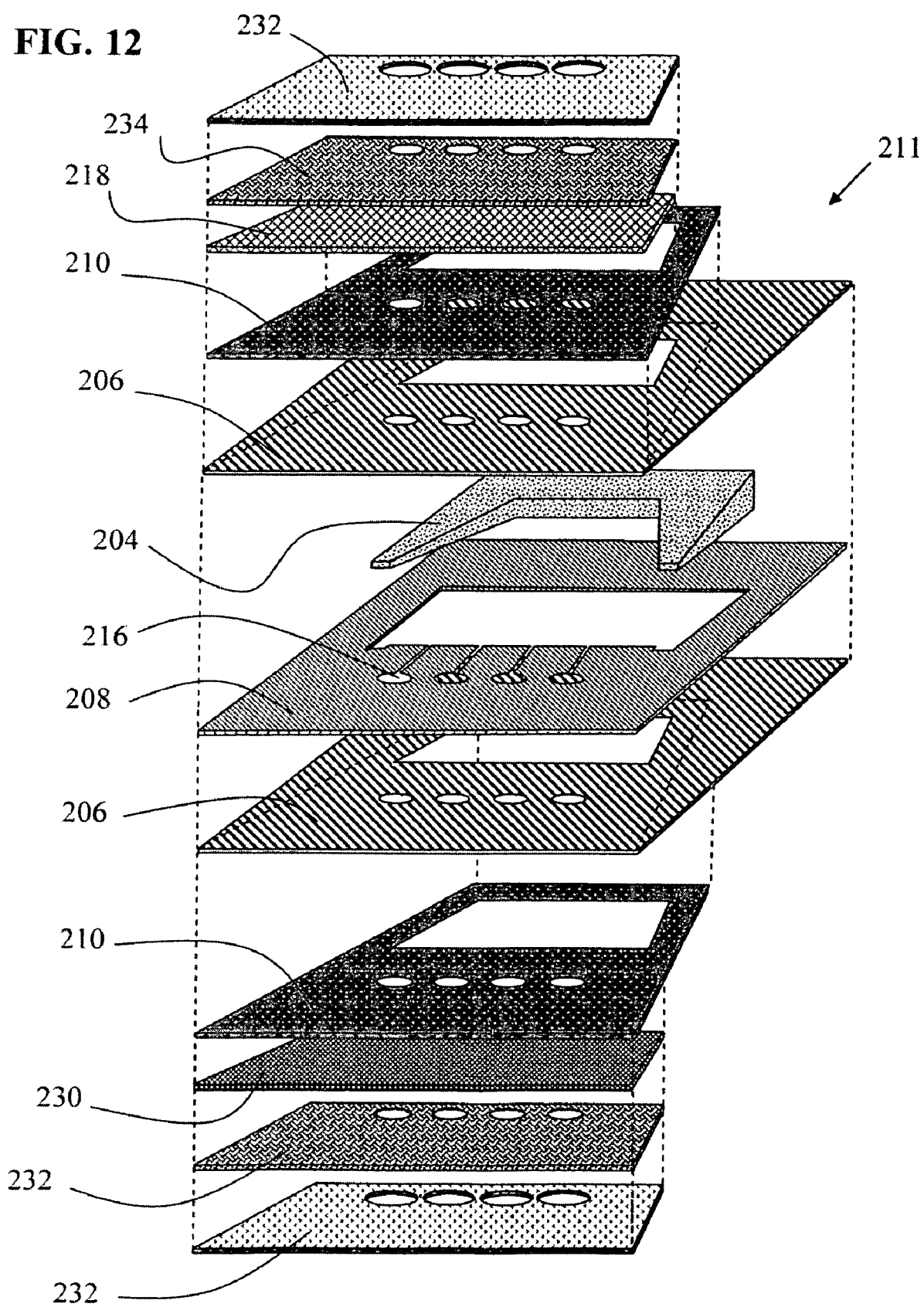
FIG. 12, an isometric view, illustrates yet another embodiment of the present invention in which additional features are added to structurally support the vent diaphragm layers during deployment.

FIG. 12 (an isometric view) illustrates structural supporting layers (added to the embodiment seen in FIG. 10) to mitigate any delaminating forces on the vent screen layer 218 and diaphragm layer 230 as the interface composition 204 is liquefied and forced into the vent apertures 216. The additional support may include cap layers 232 adhesively bonded (via an adhesive layer 234) to both the vent screen layer 218 and diaphragm layer 230. The cap layers 232 act as stiffeners to mitigate any peel or delaminating forces between the vent screen layer 218, diaphragm layer 230 and their respective coating layers 210.

Figure 13:
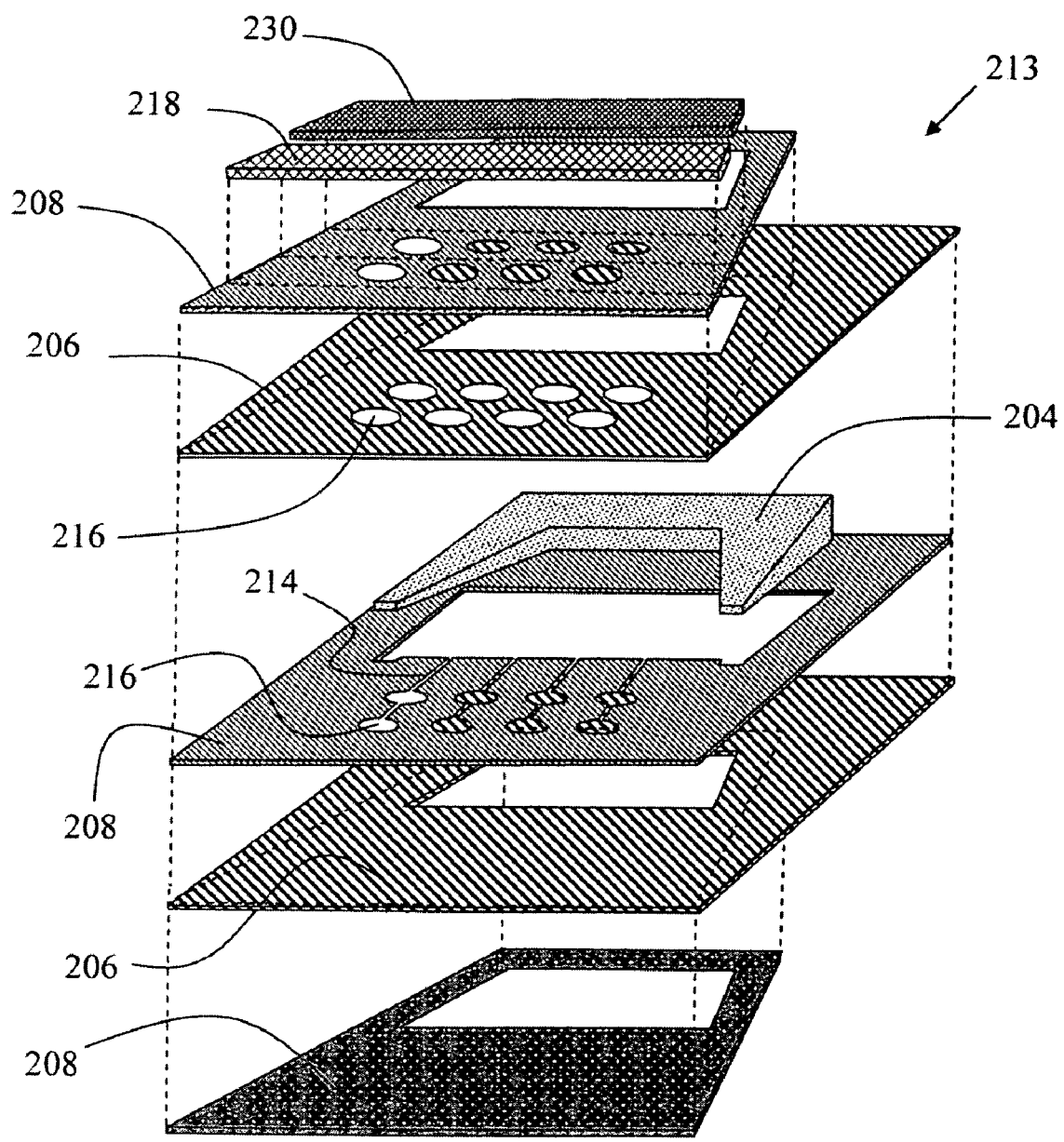
FIG. 13, an isometric view, illustrates still another embodiment of the present invention in which the diaphragm and vent layers are positioned serially along channel features to facilitate venting of entrapped air and contain excess metallic interface material.

FIG. 13 (an isometric view) illustrates yet another embodiment of the present invention wherein the diaphragm and vent layers (both immediately adjacent vent apertures 216) are positioned serially along the ducts 214. As metallic interface composition 204 is liquefied and flowed, any entrapped air may be expelled via the liquid impermeable vent screen layer 218. Any excess interface composition 204 may be accommodated within the flexible volume created by the diaphragm material expanding immediately adjacent the vent apertures 216.

Figure 14:
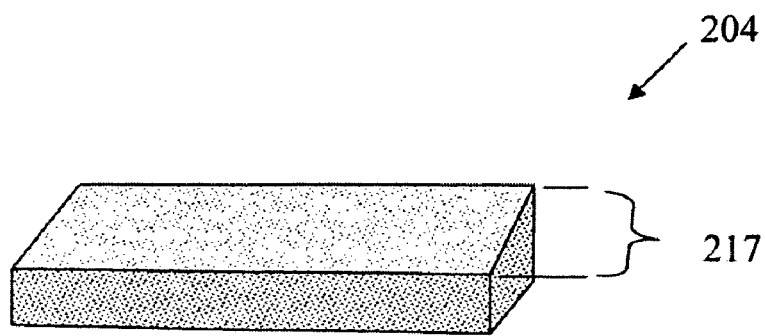
FIGS. 14 through 16, isometric views, illustrate various metallic interface material shapes in the present invention.
Figure 15:
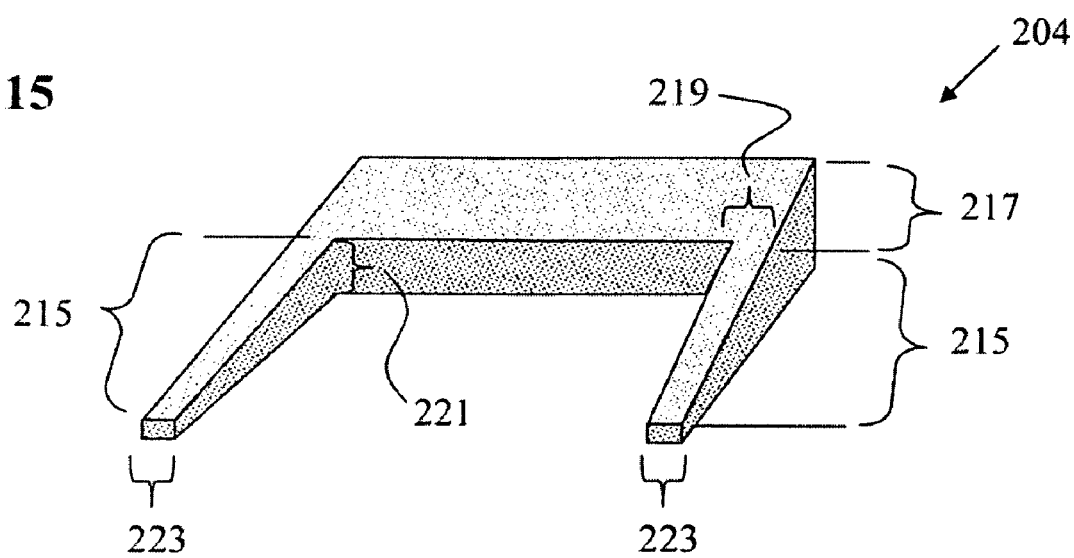
Figure 16:
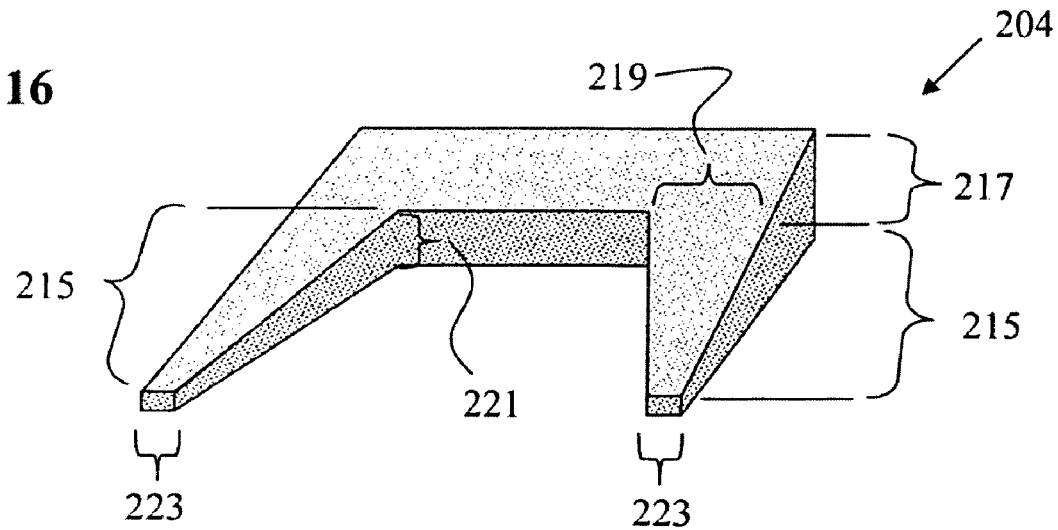

FIGS. 14 through 16 (isometric views) illustrate various metallic interface composition 204 shapes which facilitate the directional flow (upon liquefaction of the composition) toward the ducts and vent apertures (seen in FIGS. 5 through 13). As seen in FIG. 14, a minimum interface composition shape 204 may be comprised of at least one leading edge segment 217.

FIG. 15 illustrates one leading edge segment 217 combined with leg segments 215 to yield a complete metallic interface composition shape 204. It can also be seen that the leg segments' 215 thickness is reduced from the leading edge segment connection region 221 down to the leg tips 223. For ease of manufacture, the leg faces 219 may be uniform in width from the segment connection region 221 to the leg tips 223.

Within FIG. 16 it can be seen that a metallic interface composition shape 204 includes tapered leg faces 219 in addition to a taper of each leg segments' 215 thickness (both (from the segment connection region 221 down to the leg tips 223). The taper of the leg segments' 215 thickness and width may be accomplished by soldering metallic interface composition (in liquid form) onto a tapered width pattern on a substrate (such as one of the cover layers seen in FIGS. 5-13). The liquid interface composition will deposit a volume of the composition in proportion to the exposed surface on the substrate, yielding a taper in thickness as the substrate's pattern width tapers.

Figure 17:
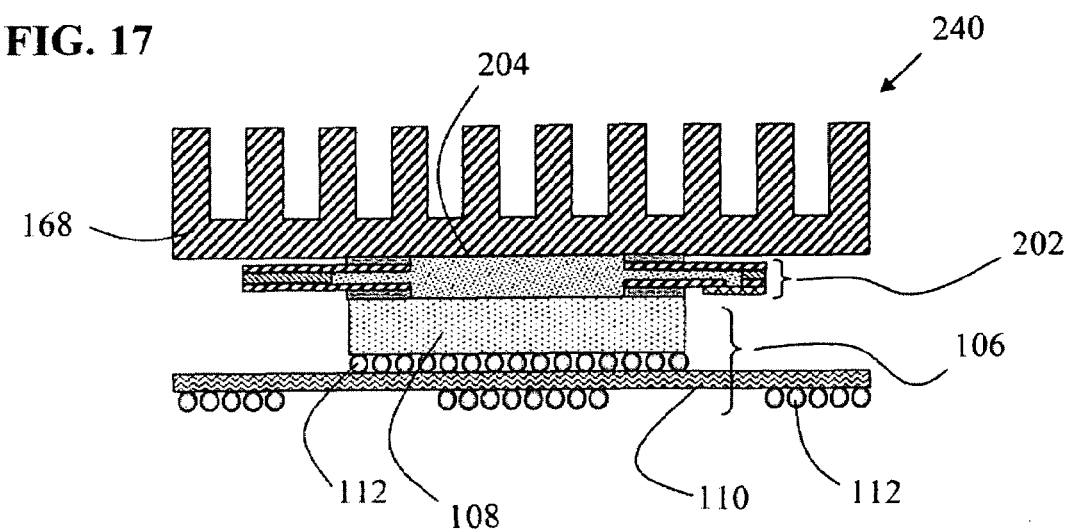
FIG. 17, a sectional view, illustrates one metallic interface material structure embodiment of the present invention between an IC chip and heat sink.

FIG. 17 illustrates a "bare die" electronic assembly 240 including an electronic component 106 (comprised of an IC chip 108, package substrate 110, and electrical interconnection vias 112), heat exchanger (heat sink) 168, and thermal interface structure 202 (of the present invention). The thermal interface structure 202 facilitates a high performance thermal path between the IC chip 108 and heat sink 168.

Figure 18:
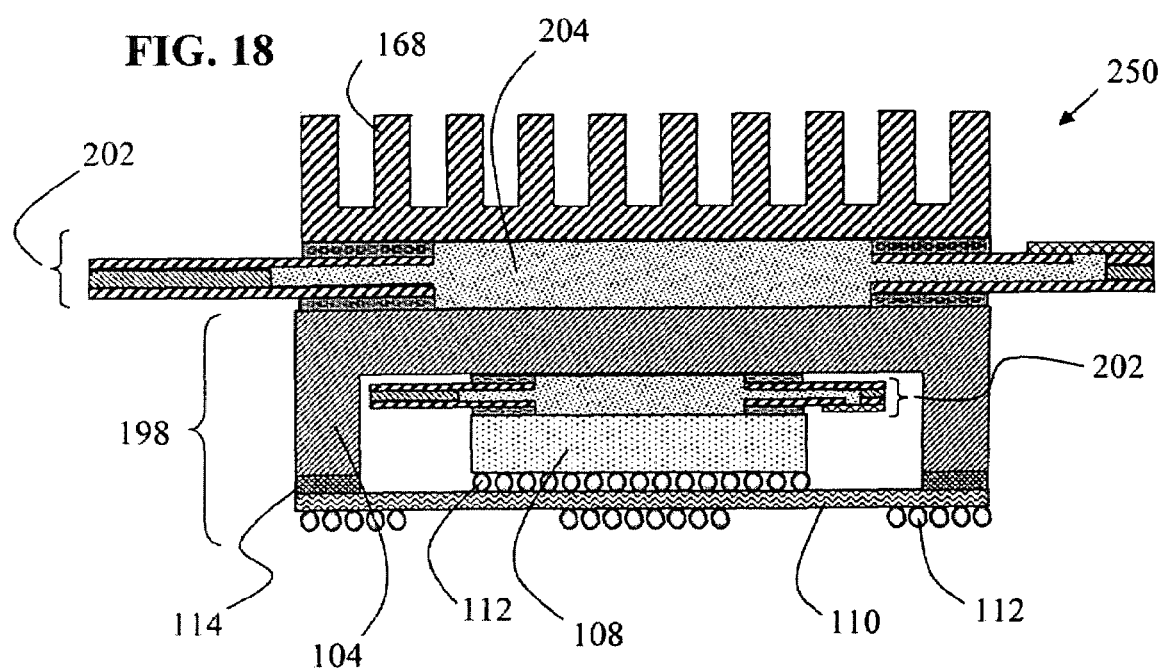
FIG. 18, a sectional view, illustrates another metallic interface material structure embodiment of the present invention positioned between an IC chip and heat spreader lid and between the lid and heat sink.

Within FIG. 18, it can be seen that a "lidded" electronic assembly 250 includes a heat spreader lid 104 (with the thermal interface structure 202 of the present invention between the lid 104 and IC chip 108) and a heat sink 168, also with a thermal interface structure 202 of the present invention. The resultant electronic assembly, providing a metallic-based heat path from the IC chip 108 to the heat sink 168, would possess high thermal performance with a high degree of reliability and ease of deployment.

Several embodiments of the present invention have been described. A person skilled in the art, however, will recognize that many other embodiments are possible within the scope of the claimed invention. For this reason, the scope of the invention is not to be determined from the description of the embodiments, but must instead be determined solely from the claims that follow.

The invention claimed is:

1. An electronic assembly including an electronic component, heat exchanger, and thermal interface structure comprised of a metallic interface composition and encapsulating structure, the assembly comprising:
    (a) the metallic interface composition disposed between the electronic component and heat exchanger, said metallic interface composition positioned near the periphery of the electronic component thereby forming a washer shaped metallic seal member, and said seal member including at least one inboard face and at least one outboard face, said inboard face surrounding a space devoid of metallic interface composition;
    (b) a seal comprised of the metallic interface composition and encapsulating structure including at least one vent forming a space devoid of metallic interface composition between the electronic component and the heat exchanger, said seal including an inner and outer perimeter encapsulating said metallic interface composition with the exception of at least one inboard face; and
    (c) the metallic interface composition when liquefied is able to flow, filling surface asperities and the interfacial space, said space defining the metallic seal inboard face.

2. The assembly in claim 1 wherein the vent connects the space, defined by the seal, to the region beyond the outer perimeter.

3. The assembly in claim 1 wherein the metallic interface composition has at least one tapered dimension.

4. The assembly in claim 1 wherein the metallic interface composition is applied around the periphery of the electronic component in a non-uniform manner.

5. The assembly in claim 1 wherein a disproportionately large quantity of metallic interface composition is positioned on the electronic component opposite the vent.

6. The assembly in claim 5 wherein the liquefied metallic interface composition is able to directionally flow from the disproportionately large quantity of metallic interface composition toward the vent.

7. The assembly in claim 1 wherein the space is in the form of a trapezoid having its narrow most dimension at the vent side of the thermal interface structure.

8. The assembly in claim 1 wherein at least one portion of the encapsulating structure is able to extend laterally as the metallic interface composition liquefies and flows.

9. The assembly in claim 1 wherein the metallic interface composition includes an intrinsic oxygen getter selected from the group consisting of rare earth metals, alkali metals, alkaline-earth metals, refractory metals, and mixtures and alloys thereof.

10. The assembly in claim 1 wherein the metallic interface composition is liquid at the operating temperature range of the electronic component.

11. A thermal interface structure for transferring heat from an electronic component to a heat exchanger, the structure comprising:
    (a) a metallic interface composition disposed between the electronic component and heat exchanger, said metallic interface composition positioned near the periphery of the electronic component thereby forming a washer shaped metallic seal member, and said seal member including at least one inboard face and at least one outboard face, said inboard face surrounding a space devoid of metallic interface composition;
    (b) a seal comprised of the metallic interface composition and encapsulating structure including at least one vent forming a space devoid of metallic interface composition between the electronic component and the heat exchanger, said seal including an inner and outer perimeter encapsulating said metallic interface composition with the exception of at least one inboard face; and
    (c) the liquefied metallic interface composition is able to flow, filling surface asperities and the interfacial spaces, said space defining the metallic seal inboard face.

12. The structure in claim 11 wherein the vent connects the space, defined by the seal, to the region beyond the outer perimeter.

13. The structure in claim 1 wherein the metallic interface composition has at least one tapered dimension.

14. The assembly in claim 11 wherein the metallic interface composition is applied around the periphery of the electronic component in a non-uniform manner.

15. The assembly in claim 11 wherein a disproportionately large quantity of metallic interface composition is positioned on the electronic component opposite the vent.

16. The assembly in claim 15 wherein the liquefied metallic interface composition is able to directionally flow from the disproportionately large quantity of metallic interface composition toward the vent.

17. The assembly in claim 15 wherein the space is in the form of a trapezoid having its narrow most dimension at the vent side of the thermal interface structure.

18. The assembly in claim 11 wherein at least one portion of the encapsulating structure is able to extend laterally as the metallic interface composition liquefies and flows.

19. The structure in claim 11 wherein the metallic interface composition includes an intrinsic oxygen getter selected from the group consisting of rare earth metals, alkali metals, alkaline-earth metals, refractory metals, and mixtures and alloys thereof.

20. The structure in claim 11 wherein the metallic interface composition is liquid at the operating temperature range of the electronic component.

21. A thermal interface structure for transferring heat from an electronic component to a heat exchanger, the structure comprising:
    (a) a metallic interface composition disposed between the electronic component and heat exchanger, said metallic interface composition positioned near the periphery of the electronic component thereby forming a washer shaped metallic seal member, and said seal member including at least one inboard face and at least one outboard face, said inboard face surrounding a space devoid of metallic interface composition;
    (b) a seal comprised of the metallic interface composition and encapsulating structure including at least one vent forming a space devoid of metallic interface composition between the electronic component and the heat exchanger, said seal including an inner and outer perimeter encapsulating said metallic interface composition with the exception of at least one inboard face; and (c) the liquefied metallic interface composition is able to flow, filling surface asperities and the interfacial space, which includes at least one diaphragm.

22. The structure in claim 21 wherein the vent connects the space, defined by the seal, to the region beyond the outer perimeter.

23. The structure in claim 21 wherein the metallic interface composition has at least one tapered dimension.

24. The assembly in claim 21 wherein the metallic interface composition is applied around the periphery of the electronic component in a non-uniform manner.

25. The assembly in claim 21 wherein a disproportionately large quantity of metallic interface composition is positioned on the electronic component opposite the vent.

26. The assembly in claim 25 wherein the liquefied metallic interface composition is able to directionally flow from the disproportionately large quantity of metallic interface composition toward the vent.

27. The assembly in claim 25 wherein the space is in the form of a trapezoid having its narrow most dimension at the vent side of the thermal interface structure.

28. The assembly in claim 21 wherein at least one portion of the encapsulating structure is able to extend laterally as the metallic interface composition liquefies and flows.

29. The structure in claim 21 wherein the metallic interface composition includes an intrinsic oxygen getter selected from the group consisting of rare earth metals, alkali metals, alkaline-earth metals, refractory metals, and mixtures and alloys thereof.

30. The structure in claim 21 wherein the metallic interface composition is liquid at the operating temperature range of the electronic component.

31. A method of manufacturing an electronic assembly including at least one IC chip comprising an electronic component, at least one heat exchanger and at least one thermal interface structure, said thermal interface structure comprised of a metallic interface composition and encapsulating structure and including at least one vent, the method comprising:
 (a) Forming a sandwich comprised of the electronic component, heat exchanger and thermal interface structure wherein the metallic interface composition is disposed between the electronic component and heat exchanger, said metallic interface composition positioned near the periphery of the electronic component thereby forming a washer shaped metallic seal member, and said seal member including at least one inboard face and at least one outboard face, said inboard face surrounding a space devoid of metallic interface composition; and
 (b) Heating the thermal interface structure causing the metallic interface composition to liquefy and flow, filling surface asperities and the interfacial space, which includes at least one vent.

32. The method of claim 31 wherein the thermal interface structure includes at least one diaphragm.

33. The method of claim 31 wherein the metallic interface composition is initially formed with a tapered thickness and face.

34. The method in claim 31 wherein the metallic interface composition is applied around the periphery of the electronic component in a non-uniform manner.

35. The method in claim 31 wherein a disproportionately larger quantity of metallic interface composition is positioned on the electronic component opposite the vent.

36. The method in claim 35 wherein the liquefied metallic interface composition is able to directionally flow from the disproportionately large quantity of metallic interface composition toward the vent.

37. A method of manufacturing a thermal interface structure disposed between an electronic component and heat exchanger, the structure comprised of a metallic interface composition, said metallic interface composition positioned near the periphery of the electronic component thereby forming a washer shaped metallic seal member, and said seal member with at least one inboard face and at least one outboard face, said inboard face surrounding a space devoid of metallic interface composition and an encapsulating structure comprised of cover layers and a duct layer, said duct layer including a vent, duct and vent aperture, the method comprising:
 (a) Sandwiching a duct layer comprising at least one vent comprised of at least one duct and at least one vent aperture between cover layers; and
 (b) Positioning a metallic interface composition between the cover layers, adjacent the duct layer wherein a larger quantity of the metallic interface composition is opposite the vent.

38. The method in claim 37 wherein the metallic interface composition is encapsulated by the encapsulating structure with the exception of at least one inboard face.

39. The method of claim 37 wherein the thermal interface structure includes at least one diaphragm.

40. The method of claim 37 wherein the metallic interface composition is initially formed with a tapered thickness and face.

41. The method in claim 37 wherein the metallic interface composition is applied around the periphery of the electronic component in a non-uniform manner.

* * * * *